(12) United States Patent
Rehmeyer et al.

(10) Patent No.: US 11,929,139 B2
(45) Date of Patent: Mar. 12, 2024

(54) METHODS FOR OPTIMIZING SEMICONDUCTOR DEVICE PLACEMENT ON A SUBSTRATE FOR IMPROVED PERFORMANCE, AND ASSOCIATED SYSTEMS AND METHODS

(71) Applicant: Micron Technology, Inc., Boise, ID (US)

(72) Inventors: James S. Rehmeyer, Boise, ID (US); Christopher G. Wieduwilt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/718,200

(22) Filed: Apr. 11, 2022

(65) Prior Publication Data
US 2023/0068666 A1 Mar. 2, 2023

Related U.S. Application Data

(60) Provisional application No. 63/238,467, filed on Aug. 30, 2021.

(51) Int. Cl.
*G11C 5/02* (2006.01)
*G11C 5/04* (2006.01)
*G11C 29/50* (2006.01)

(52) U.S. Cl.
CPC .............. *G11C 5/025* (2013.01); *G11C 5/04* (2013.01); *G11C 29/50004* (2013.01); *G11C 29/50012* (2013.01); *G11C 2029/5002* (2013.01); *G11C 2029/5004* (2013.01); *G11C 2029/5006* (2013.01)

(58) Field of Classification Search
CPC ..... G11C 5/025; G11C 5/04; G11C 29/50004; G11C 29/50012; G11C 2029/5002; G11C 2029/5004; G11C 2029/5006
See application file for complete search history.

(56) References Cited

U.S. PATENT DOCUMENTS

| | | | | |
|---|---|---|---|---|
| 10,372,366 | B2 * | 8/2019 | Bennett | G06F 11/108 |
| 10,692,543 | B2 * | 6/2020 | Na | H01L 25/0657 |
| 10,891,988 | B2 * | 1/2021 | Park | G11C 7/222 |
| 2008/0040081 | A1 * | 2/2008 | Nishio | G06F 30/20 |
| | | | | 703/1 |

* cited by examiner

*Primary Examiner* — Vanthu T Nguyen
(74) *Attorney, Agent, or Firm* — Perkins Coie LLP

(57) ABSTRACT

Methods of optimizing the placement of memories in a memory device including a substrate and an electrical component, and associated devices and systems, are disclosed herein. A representative method includes first testing the memories to determine at least one parameter for each of the memories indicating an ability of the memory to process signals from the electrical component. The method can further include labeling each memory with a label based on the parameter, the labels including at least a first label and a second label. The first label can indicate that the memories with the first label are better able to process signals from the electrical component than the memories with the second label. The method can further include electrically coupling the memories to the substrate such that the memories with the second label are positioned closer to the electrical component than the memories with the first label.

22 Claims, 11 Drawing Sheets

METHODS FOR OPTIMIZING SEMICONDUCTOR DEVICE PLACEMENT ON A SUBSTRATE FOR IMPROVED PERFORMANCE, AND ASSOCIATED SYSTEMS AND METHODS

CROSS-REFERENCE TO RELATED APPLICATION(S)

The present application claims priority to U.S. Provisional Patent Application No. 63/238,467, filed Aug. 30, 2021, the disclosure of which is incorporated herein by reference in its entirety.

TECHNICAL FIELD

The present disclosure generally relates to methods for optimizing the placement of semiconductor devices, such as memory devices, on a substrate for improved performance.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Improving memory packages, generally, may include increasing memory cell density, increasing read/write speeds or otherwise reducing operational latency, increasing reliability, increasing data retention, reducing power consumption, reducing manufacturing costs, and reducing the size or footprint of the memory packages and/or components of the memory devices, among other metrics.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
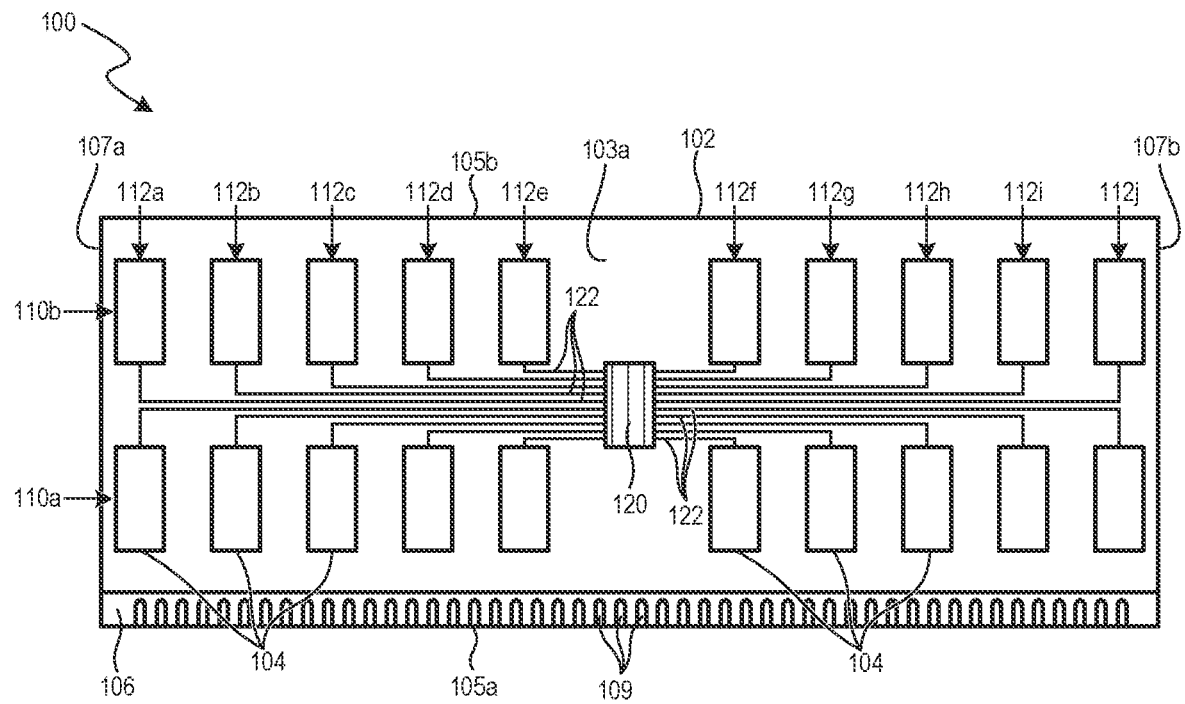
FIG. 1A is a partially schematic front view of a memory device in accordance with embodiments of the present technology.

Embodiments of the present technology are directed to methods for optimizing the placement of memories in a memory device (e.g., a dual in-line memory module (DIMM)) for improved performance, and associated systems and devices. In several of the embodiments described below, the memory device includes a substrate and an electrical component coupled to the substrate. A method for optimizing the placement of the memories along the substrate can include first testing the memories to determine at least one parameter for each of the memories indicating an ability of the memory to process signals from the electrical component. The method can further include labeling each memory with a label based on the parameter, the labels including at least a first label and a second label. The first label can indicate that the memories with the first label are better able to process signals from the electrical component than the memories with the second label. The method can further include electrically coupling the memories to the substrate such that the memories with the second label are positioned closer to the electrical component than the memories with the first label.

In some embodiments, the electrical component can be a power management integrated circuit (PMIC), and the at least one parameter can be a power performance level of each memory indicating an ability of the memory to process power signals received from the PMIC. In some embodiments, the electrical component can be a registered clock driver (RCD), and the at least one parameter can be a signal integrity level of the each memory indicating an ability of the memory to process command, address, and/or clock signals received from the RCD. In some embodiments, the electrical component can be an edge connector, and the at least one parameter can be a signal integrity level of each memory indicating an ability of the memory to process data signals received from the edge connector or transmitted to the edge connector.

In some embodiments, the at least one parameter can be an electrical parameter such a threshold voltage, propagation delay, memory power consumption, and so on. The at least one parameter (e.g., an electrical parameter) can be different for some or all of the memories due to physical variations in a manufacturing process used to manufacture the memories, such as variations in impurity concentration density, oxide thicknesses and diffusion depths, etching and fill dimensions, and so on. In some aspects of the present technology, positioning the memories with the second label—that are worse able to process signals from the electrical component—closer to the electrical component than the memories with the first label can improve the performance of the memory device (e.g., by increasing processing speed, decreasing power consumption, increasing signal quality). For example, the memories with the second label can receive more robust and/or precise signals from the electrical component than the memories with the first label due to the reduced distance of electrical signal transmission along the substrate. Accordingly, the memories can be positioned along the substrate to optimize their performance based on their individual performance parameters resulting from variations in the manufacturing process used to form the memories. In contrast, conventional manufacturing techniques simply place memories along a substrate randomly, without consideration for process variations in the memories and the resulting effect on performance caused by varying supply voltages due to the placement of the memories on the substrate.

Numerous specific details are discussed to provide a thorough and enabling description of embodiments of the present technology. A person skilled in the art, however, will understand that the technology may have additional embodiments and that the technology may be practiced without several of the details of the embodiments described below with reference to FIGS. 1-10. In other instances, well-known structures or operations often associated with memory devices are not shown, or are not described in detail, to avoid obscuring other aspects of the technology. In general, it should be understood that various other devices and systems in addition to those specific embodiments disclosed herein may be within the scope of the present technology. For example, in the illustrated embodiments below, the memory devices and systems are primarily described in the context of DIMMs compatible with DRAM and flash (e.g., NAND and/or NOR) storage media. Memory devices and systems configured in accordance with other embodiments of the present technology, however, can include memory modules compatible with other types of storage media, including PCM, RRAM, MRAM, read only memory (ROM), erasable programmable ROM (EPROM), electrically erasable programmable ROM (EEROM), ferroelectric, magnetoresistive, and other storage media, including static random-access memory (SRAM).

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1B:
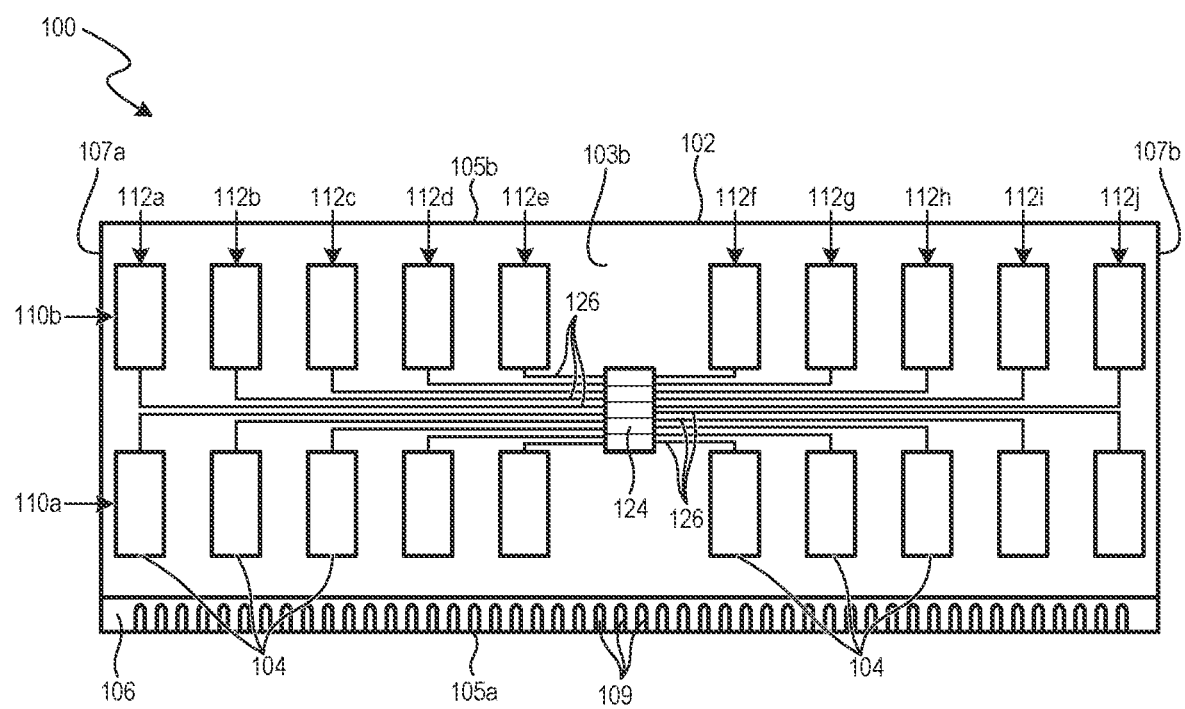
FIGS. 1B and 1C are partially schematic back views of the memory device of FIG. 1A in accordance with embodiments of the present technology.
Figure 1C:
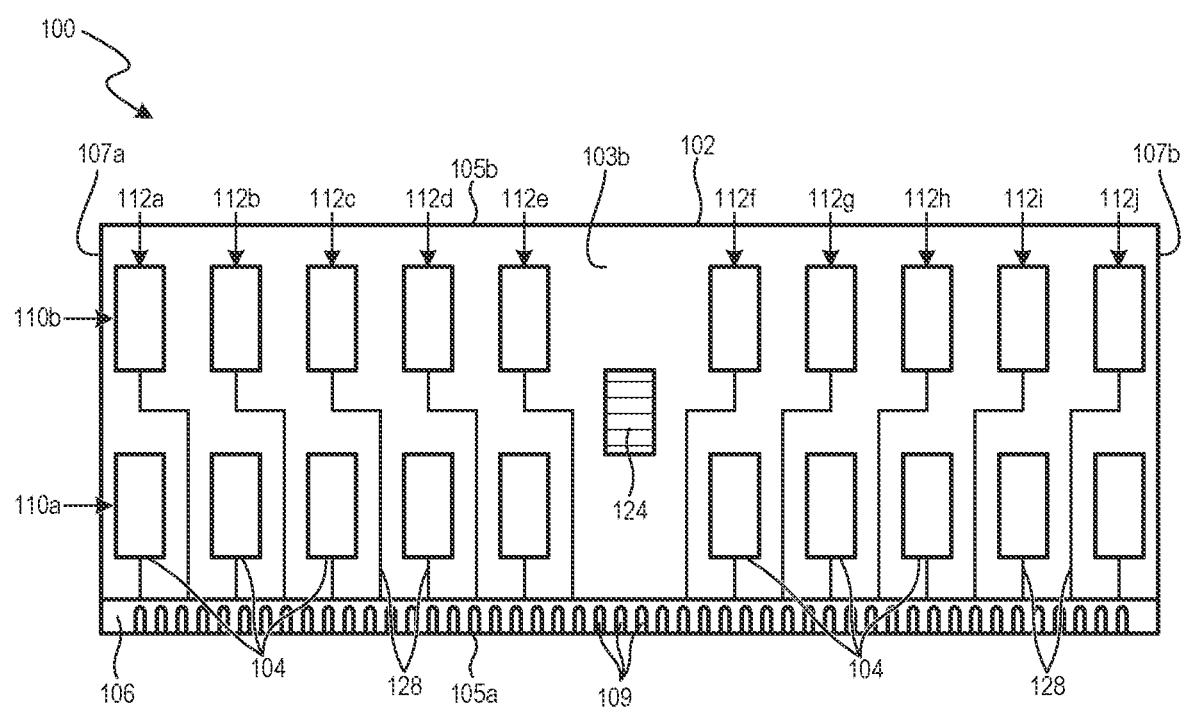

FIG. 1A is a partially schematic front view of a memory device 100 in accordance with embodiments of the present technology. FIGS. 1B and 1C are partially schematic back views of the memory device 100 in accordance with embodiments of the present technology. Referring to FIGS. 1A-1C together, the memory device 100 can be a memory module, such as a dual in-line memory module (DIMM) including a substrate 102 having a first side 103a (FIG. 1A; e.g., a front side) and an opposing second side 103b (FIGS. 1B and 1C; e.g., a back side). The substrate 102 can be a printed circuit board (PCB) or the like. In some embodiments, the substrate 102 can be configured in accordance with and/or to comply with the compute express link (CXL) interconnection standard. A plurality of memories 104 are coupled to the first side 103a and the second side 103b of the substrate 102. The memories 104 can be coupled to the substrate 102 via electrical connectors (e.g., solder balls; not shown). In general, the memories 104 can include one or more (e.g., multiple stacked) semiconductor dies each including integrated memory circuitry and/or logic circuitry, which can include various types of semiconductor components and functional features, such as dynamic random-access memory (DRAM), static random-access memory (SRAM), flash memory, other forms of integrated circuit memory, processing circuits, and/or other semiconductor features. In some embodiments, the memories 104 can be DRAM memories (e.g., DRAM memory dies, DRAM memory chips, DRAM memory packages, or the like). In some embodiments, the memories 104 can be identical (e.g., DRAM memory packages manufactured to have the same design and specifications), while in other embodiments the memories 104 can be different from each other (e.g., including different types of memory dies or different combinations of controller, logic, and/or memory dies).

In the illustrated embodiment, the substrate 102 has a generally rectangular shape including (i) a lower edge 105a opposite an upper edge 105b and (ii) a first lateral edge 107a opposite a second lateral edge 107b. The memory device 100 can further include an edge connector 106 along (e.g., defining, coupled to) the lower edge 105a of the substrate 102. The edge connector 106 can include a plurality of contacts 109 for connecting the memories 104 to external circuitry (not shown). In some embodiments, for example, the edge connector 106 can be used to releasably secure the memory device 100 in a corresponding DIMM slot in a host device (e.g., a motherboard). More particularly, the edge connector 106 can connect a command/address bus and/or a data bus of the memory device 100 to the host device for, for example, receiving and/or transmitting data signals to/from the connected host device during memory access operations.

In some embodiments, the memories 104 are arranged on the first and second sides 103a-b of the substrate 102 in rows extending between the lateral edges 107a-b and/or columns extending between the lower and upper edges 105a-b. In the illustrated embodiment, for example, the memories 104 on each of the first and second sides 103a-b are arranged in (i) two rows 110 (identified individually as a first row 110a and a second row 110b) each including ten of the memories 104 and (ii) ten columns 112 (identified individually as first through tenth columns 112a-112j, respectively) each including two of the memories 104. In other embodiments, the memories 104 can be arranged differently and/or can comprise a different number. For example, more or fewer than the illustrated forty memories 104 can be arranged in any number of rows and/or columns on the first and second sides 103a-b of the substrate 102, the memories 104 can be asymmetrically aligned on the first and second sides 103a-b, and so on.

In some embodiments, the memory device 100 can include other electrical components (e.g., semiconductor components, integrated circuit components) coupled to the substrate 102. Referring to FIG. 1A for example, the memory device 100 can include a voltage regulator or power management integrated circuit (PMIC) 120 coupled to the first side 103a of the substrate 102 and electrically coupled to the memories 104 on both the first and second sides 103a-b of the substrate 102 via corresponding first electrical lines 122 (shown schematically; e.g., electrical traces, electrical routes) extending through/along the substrate 102. In the illustrated embodiment, the PMIC 120 is positioned in a center, or substantially in the center, of the first side 103a of the substrate 102 between the rows 110 and the columns 112 (e.g., between the first and second rows 110a-b and between the fifth and sixth columns 112e-f). The PMIC 120 can include one or more voltage regulators to convert a supply voltage to one or more output voltages (e.g., VDD, VDDQ, VPP, VSS, VSSQ) for use by one or more of the memories 104.

Referring to FIG. 1B, the memory device 100 can further include a registering clock driver (RCD) 124 coupled to the second side 103b of the substrate 102 and electrically coupled to the memories 104 on both the first and second sides 103a-b of the substrate 102 via corresponding second electrical lines 126 (shown schematically; e.g., electrical traces, electrical routes) extending through/along the substrate 102. In the illustrated embodiment, the PMIC 120 is positioned in a center, or substantially in the center, of the second side 103b of substrate 102 between the rows 110 and the columns 112 (e.g., between the first and second rows 110a-b and between the fifth and sixth columns 112e-f). The RCD 124 can receive command, address, and/or clock signals from a command, address, and/or clock bus and generate memory command, address, and/or clock signals for the memories 104. Referring to FIG. 1C, each of the memories 104 can further be coupled to the edge connector 106 via corresponding third electrical lines 128 (shown schematically; e.g., electrical traces, electrical routes) extending through/along the substrate 102.

Referring to FIG. 1A, individual ones of the memories 104 can be positioned at different distances from the PMIC 120. For example, in the illustrated embodiment the memories 104 in the first through fifth columns 112a-e are positioned at different distances from the PMIC 120 and, correspondingly, the memories 104 in the sixth through tenth columns 112f-j are positioned at different distances from the PMIC 120. That is, the memories 104 in the first and tenth columns 112a, j are positioned farther the from the memories 104 in the second through ninth columns 112b-i, the memories 104 in the second and ninth columns 112b, i are positioned farther the from the memories 104 in the third through eighth columns 112c-h, and so on. Accordingly, corresponding ones of the first electrical lines 122 can have different lengths. In some aspects of the present technology, the varying lengths of the first electrical lines 122 can cause the memories 104 to receive different voltages from the PMIC 120 due to differing voltage drops across the first electrical lines 122 due to the resistances of the first electrical lines 122. For example, the memories 104 in the first and tenth columns 112a, j can receive lower supply voltages from the PMIC 120 than the memories 104 in the second through ninth columns 112b-i, the memories 104 in the second and ninth columns 112b, i can receive lower supply voltages from the PMIC 120 than the memories 104 in the third through eighth columns 112c-h, and so on.

Similarly, referring to FIG. 1B, corresponding ones of the second electrical lines 126 can have different lengths. In some aspects of the present technology, the varying lengths of the second electrical lines 126 can cause the memories 104 to receive different timing signals (e.g., command, address, and/or clock signals) from the RCD 124 due to differing voltage drops across the second electrical lines 126 due to the resistances of the second electrical lines 126. For example, the memories 104 in the first and tenth columns 112a, j can receive less precise timing signals (e.g., timing signals having less sharp/defined edges) from the RCD 124 than the memories 104 in the second through ninth columns 112b-i, the memories 104 in the second and ninth columns 112b, i can receive less precise timing signals than the memories 104 in the third through eighth columns 112c-h, and so on.

Likewise, referring to FIG. 1C, individual ones of the memories 104 can be positioned at different distances from the edge connector 106. For example, in the illustrated embodiment the memories 104 in the first row 110a are positioned closer to the edge connector 106 than the memories 104 in the second row 110b. Accordingly, corresponding ones of the third electrical lines 128 can have different lengths. In some aspects of the present technology, the varying lengths of the third electrical lines 128 can cause the memories 104 to receive different data signals from the edge connector 106 due to differing voltage drops across the third electrical lines 128 due to the resistance of the third electrical lines 128. For example, the memories 104 in the first row 110a can receive more precise data signals (e.g., data signals having more sharp/defined edges) than the memories 104 in the second row 110b.

Referring to FIGS. 1A-1C together, in some embodiments, such as where the substrate 102 is a CXL substrate, the memory device 100 can include an additional memory controller on the substrate 102, and/or can have a different number of the memories 104 and/or the memories 104 can be positioned differently along the substrate 102. Likewise, in such embodiments the memory device 100 may not include the PMIC 120 or the RCD 124, and can include other electrical components coupled to the substrate 102.

Figure 2:
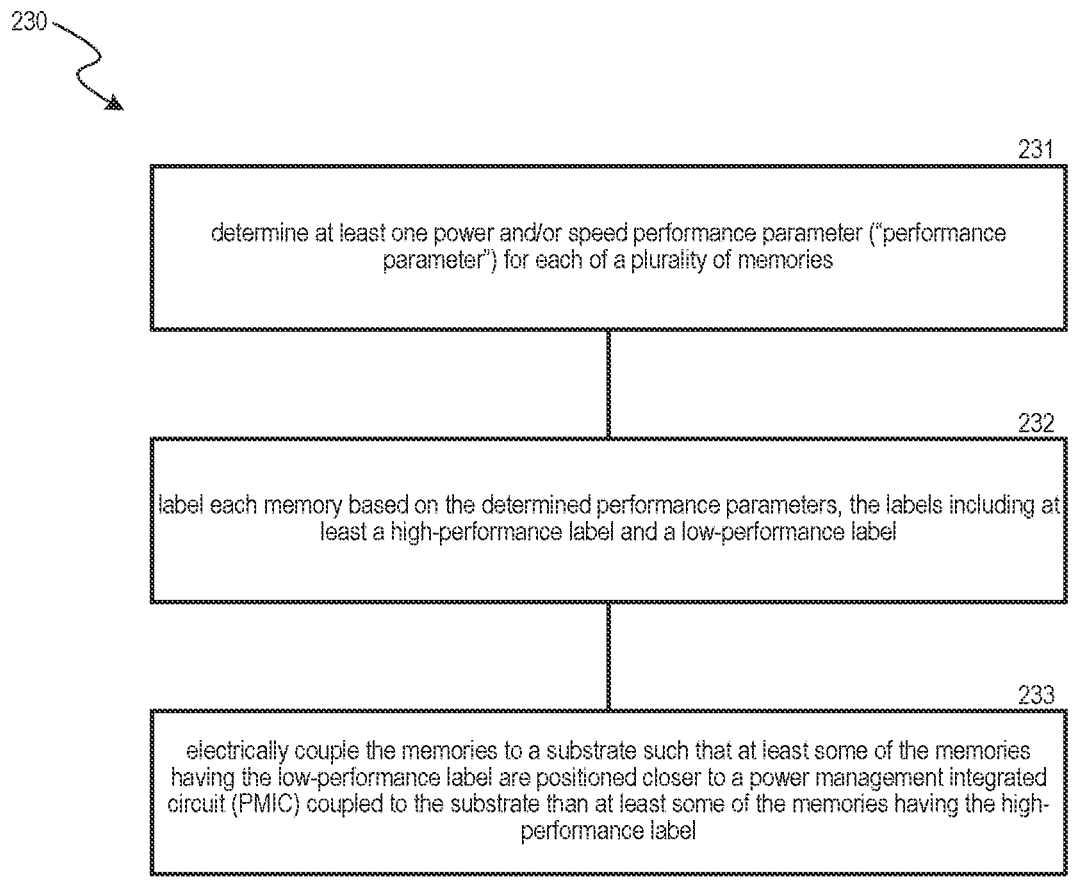
FIG. 2 is a flow diagram of a process or method for optimizing the placement of memories in the memory device of FIGS. 1A-1C in accordance with embodiments of the present technology.

FIG. 2 is a flow diagram of a process or method 230 for optimizing the placement of the memories 104 in the memory device 100 in accordance with embodiments of the present technology. Although some features of the method 230 are described in the context of the embodiments of the memory device 100 for the sake of illustration, one skilled in the art will readily understand that the method 230 can be carried out to optimize the placement of memories in other memory devices having other configurations, arrangements, etc.

Beginning at block 231, the method 230 can include determining at least one power and/or speed performance characteristic/level/parameter ("performance parameter") for each of the plurality of memories 104. For example, after manufacturing the memories 104, the memories 104 can be tested to determine the performance parameter. The performance parameter can be a voltage, current, and/or or other parameter of the memories 104. For example, the performance parameter can a threshold voltage ($V_t$), drain current ($I_{ds}$), leakage current ($I_{off}$), and/or other parameter of the memories 104 and can be determined using one or more electrical probes. In some aspects of the present technology, the performance parameter can be different for some or all of the memories 104 due to variations in a process used to manufacture the memories 104, such as variations in impurity concentration density, oxide thicknesses and diffusion depths, etching and fill dimensions, and so on.

At block 232, the method 230 can include labeling the memories 104 based on the determined performance parameters, the labels including at least a "high-performance" and a "low-performance" label. In some embodiments, the memories 104 can be labeled according to determined process corners (e.g., determined at block 231) for the N-channel (NMOS) and/or P-channel (PMOS) corners based on the exhibited carrier mobilities of the N-channels and P-channels of the memories 104. Specifically, the memories 104 can be labeled using letter designators as fast-fast (FF), slow-slow (SS), typical-typical (TT), slow-fast (SF), fast-slow (FS), and so on, where the first letter refers to the N-channel corner and the second letter refers to the P-channel corner. In some embodiments, the FF process corner can correspond to the high-performance label and the SS process corner can correspond to low-performance label. In some embodiments, the memories 104 can be labeled individually and/or to include more labels than just high performance and low performance. For example, the memories 104 can be individually labeled by ranking the performance parameter for individual ones of the memories 104 (e.g., the forty memories 104 in the memory device 100 can be ranked from fastest to slowest performance). Likewise, the memories 104 can be grouped into more than two performance bands (e.g., buckets), such as FF, SS, TT, SF, FS, and/or the like.

Figure 3A:
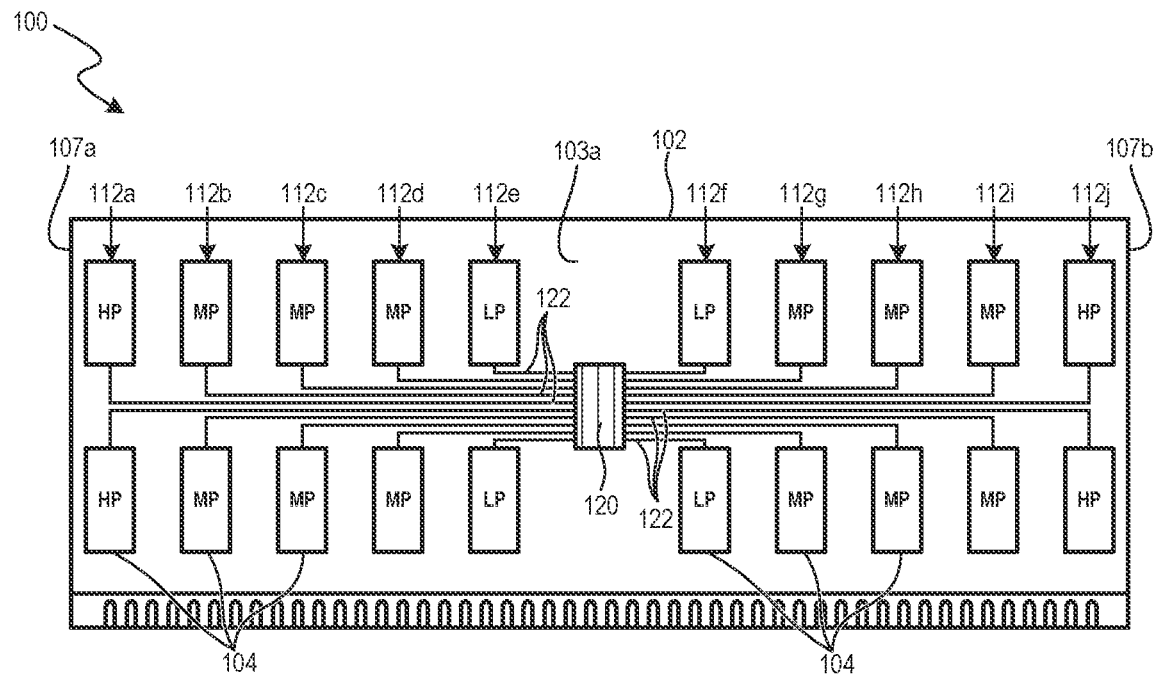
FIGS. 3A and 3B are front and back views, respectively, illustrating the optimized positioning of memories in the memory device of FIGS. 1A-1C in accordance with embodiments of the present technology.
Figure 3B:
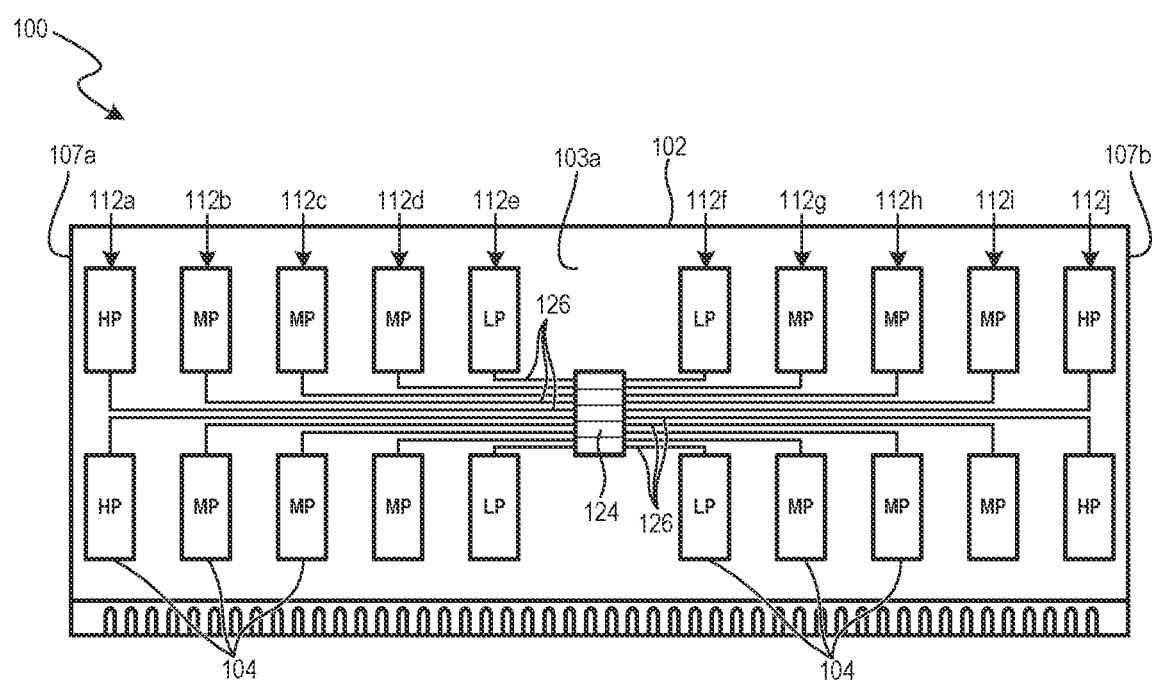

At block 233, the method 230 can include electrically coupling the memories 104 to the substrate 102 such that at least some of the memories 104 having the low-performance label are positioned closer to the PMIC 120 than at least some of the memories 104 having the high-performance label. FIGS. 3A and 3B, for example, are front and back views, respectively, illustrating the positioning of the memories 104 on the substrate 102 in accordance with embodiments of the present technology. In the illustrated embodiment, eight of the memories 104 include a high-performance label HP and eight of the memories 104 include a low-performance label LP. In some embodiments, at block 232, a predefined percentage (e.g., 20%) of the memories 104 can be labeled with the high-performance label HP and a predefined percentage (e.g., 20%) of the memories 104 can be labeled with the low-performance label LP. In some embodiments, the predefined percentages can be based on the number of rows 110 and/or columns 112 to be formed on the substrate 102. In some embodiments, the other twenty-four of the memories 104 can include a mid-performance label MP. In the illustrated embodiment, the memories 104 having the high-performance label HP are positioned (e.g., in groups) in the first and tenth columns 112a, j farthest from the PMIC 120, the memories 104 having the low-performance label LP are positioned (e.g., in groups) closest to the PMIC 120 in the fifth and sixth columns 112e, f, and the memories 104 having the mid-performance label MP are positioned (e.g., in groups) in the second through fourth columns 112c-e and the seventh through ninth columns 112g-i. That is, the memories 104 having the high-performance label HP can be positioned closet to the perimeter of the substrate 102 (farthest from the PMIC 120) toward the lateral edges 107a-b, while the memories 104 having the low-performance label LP can be positioned closest to the center of the substrate 102 (closest to the PMIC 120) away from the lateral edges 107a-b.

In some aspects of the present technology, positioning the memories 104 along the substrate 102 in this manner can improve one or more characteristics of the memory device 100 by for example, reducing the power consumption of the memory device 100, increasing the speed of the memory device 100, and so on. More specifically, the memories 104 having the high-performance label HP are positioned farthest from the PMIC 120 where they receive the lowest supply voltages from the PMIC 120 over the first electrical lines 122—but the lower supply voltages can have less impact on the performance of these memories 104 due to the high-performance characteristics of these ones of the memories 104 (e.g., having the high-performance label HP). The lower supply voltages can likewise help reduce the power these memories 104 consume. Conversely, the memories 104 having the low-performance label LP are positioned closest to the PMIC 120, where they receive the highest supply voltages from the PMIC 120—which can optimize their performance. That is, the memories 104 having the low-performance label LP are positioned to receive a more robust power signal from the PMIC 120 than the memories 104 having 104 having the high-performance label HP. Similarly, the memories 104 having the mid-performance label MP are positioned farther from the PMIC 120 than the memories 104 having the low-performance label LP but closer to the PMIC 120 than the memories 104 having the high-performance label HP—where they receive power signals having a robustness between that received at the memories 104 having the low-performance label LP and the high-performance label HP. Accordingly, the memories 104 are positioned along the substrate 102 to optimize their performance based on their individual performance parameters resulting from variations in the memory manufacturing process. In contrast, conventional manufacturing techniques simply place memories along a substrate randomly, without consideration for process variations in the memories and the resulting effect on performance caused by varying supply voltages due to the placement of the memories on the substrate.

Figure 4A:
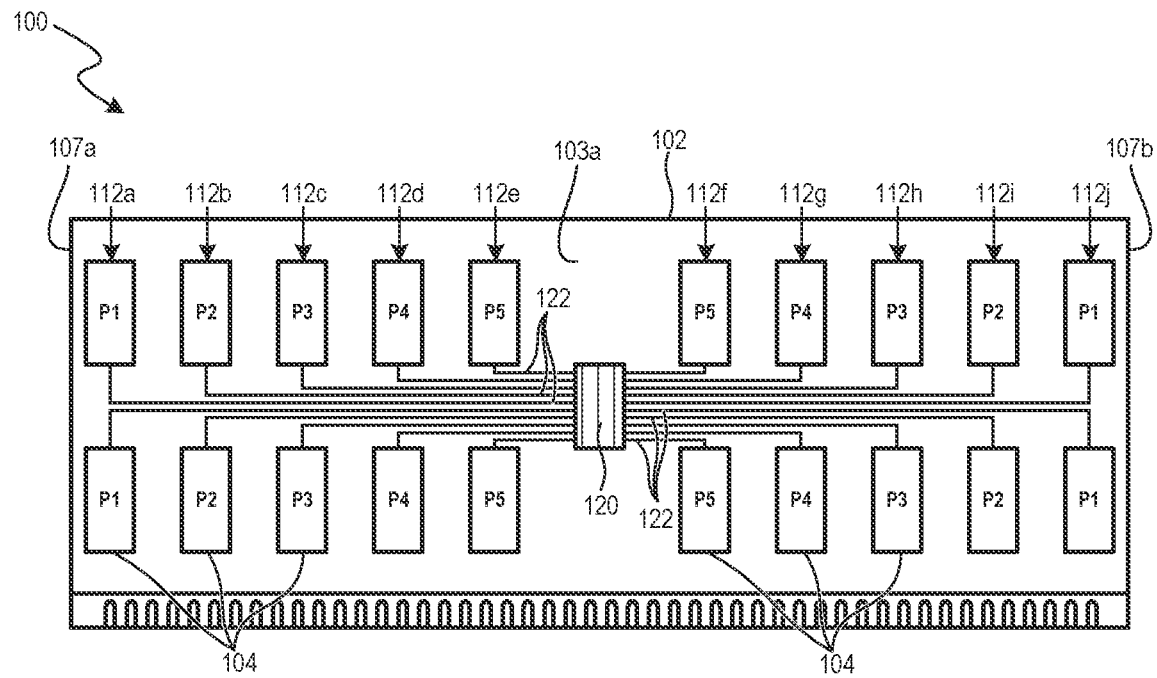
FIGS. 4A and 4B are front and back views, respectively, illustrating the optimized positioning of memories in the memory device of FIGS. 1A-1C in accordance with additional embodiments of the present technology.
Figure 4B:
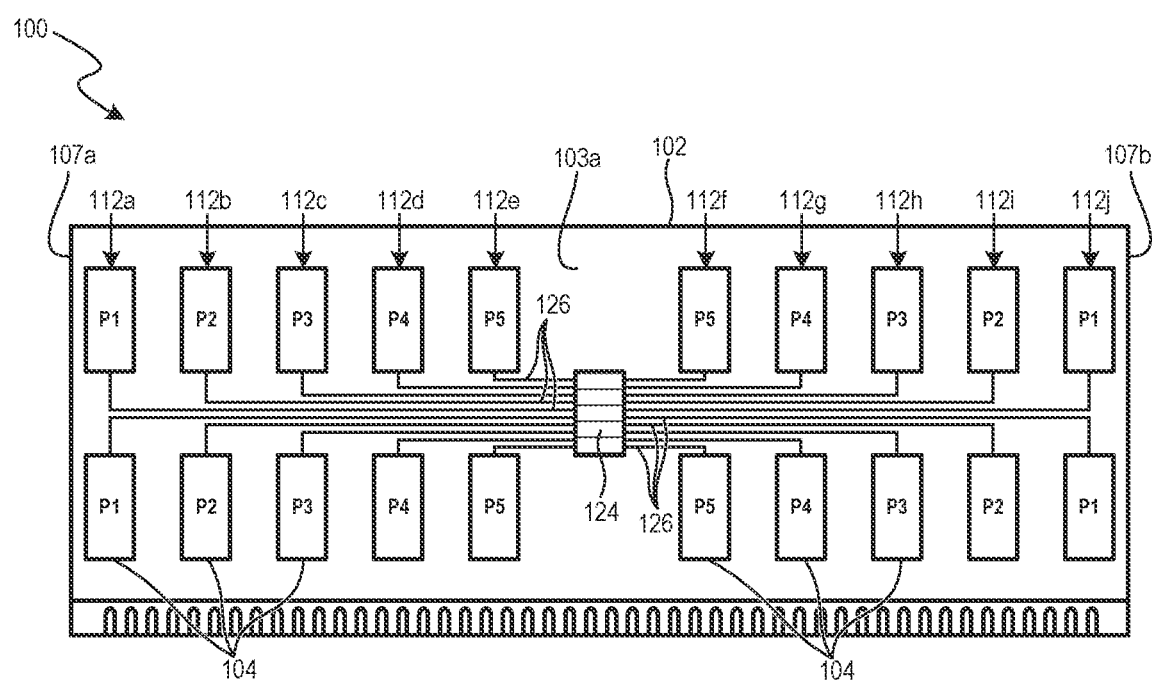

As described above, in other embodiments the memories 104 can be labeled (block 232) with more discrete/distinct labels. In such embodiments, the memories 104 can be arranged on the substrate 102 based on the labels to optimize performance of the memory device 100 by ensuring that individual ones of the memories 104 having lower-performance characteristics are positioned closer to the PMIC 120 to receive more robust power signals from the PMIC 120. FIGS. 4A and 4B, for example, are front and back views, respectively, illustrating the positioning of the memories 104 on the substrate 102 in accordance with additional embodiments of the present technology. In the illustrated embodiment, the memories 104 have been labeled with different increasing performance labels P1-P5 (block 232), with the label P1 representing the highest performing ones of the memories 104 and the label P5 representing the lowest performing ones of the memories 104. In the illustrated embodiment, the memories 104 having the label P1 are positioned in the first and tenth columns 112a, j, the memories 104 having the lower performance label P2 are positioned closer to the PMIC 120 in the second and ninth columns 112b, i, and so on. In other embodiments, the memories 104 can be labeled with more or fewer performance labels and can be positioned on the substrate 102 farther/closer to the PMIC 120 accordingly.

Figure 5:
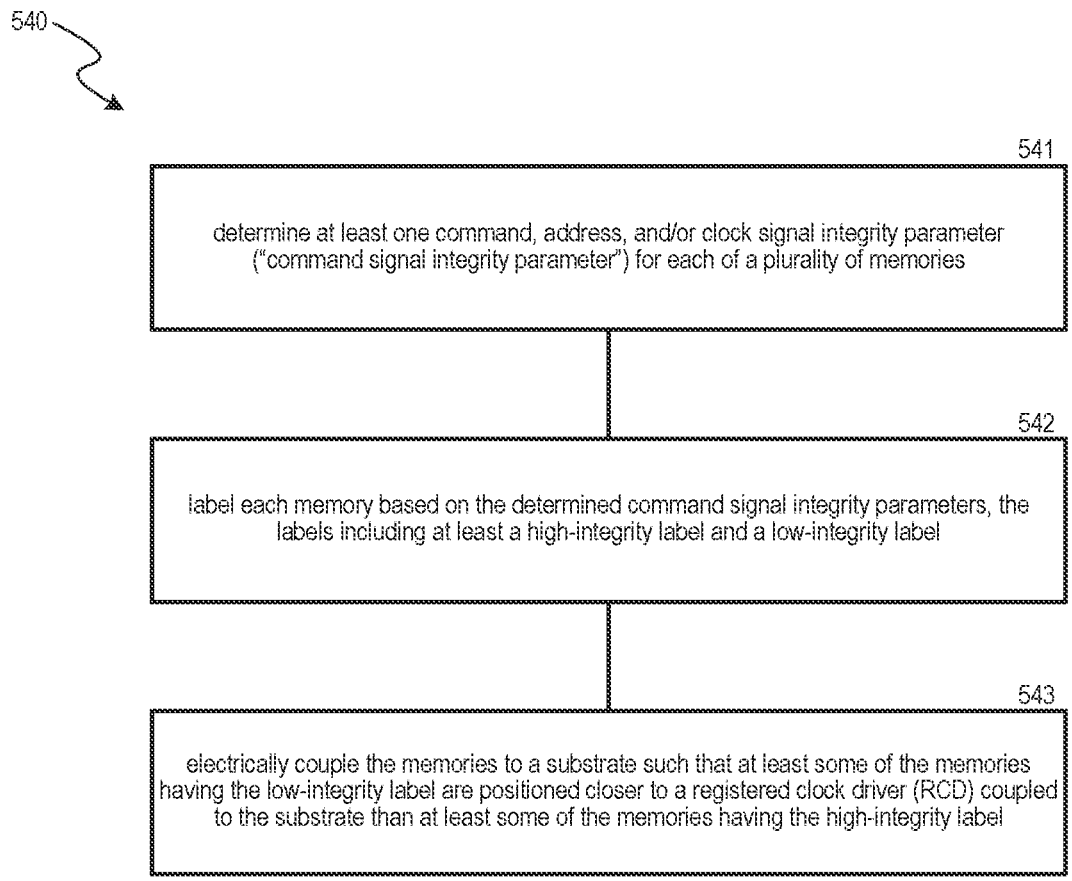
FIG. 5 is a flow diagram of a process or method for optimizing the placement of memories in the memory device of FIGS. 1A-1C in accordance with additional embodiments of the present technology.

FIG. 5 is a flow diagram of a process or method 540 for optimizing the placement of the memories 104 in the memory device 100 in accordance with additional embodiments of the present technology. Although some features of the method 540 are described in the context of the embodiments of the memory device 100 for the sake of illustration, one skilled in the art will readily understand that the method 540 can be carried out to optimize the placement of memories in other memory devices having other configurations, arrangements, etc. In some embodiments, the method 540 can include some steps that are at least generally similar to the corresponding steps of the method 230 described in detail above with reference to FIG. 2.

Beginning at block 541, the method 540 can include determining at least one command, address, and/or clock signal integrity characteristic/level/parameter ("command signal integrity parameter") for each of the plurality of memories 104. For example, after manufacturing the memories 104, the memories 104 can be tested to determine the command signal integrity parameter. In some embodiments, the command signal integrity parameter can be a setup time, a hold time, a setup-hold margin, and/or another parameter of the memories 104. In some embodiments, the signal integrity parameter can be determined using one or more electrical probes. In some aspects of the present technology, the command signal integrity parameter can be different for some or all of the memories 104 due to variations in the process used to manufacture the memories 104, such as variations in impurity concentration density, oxide thicknesses and diffusion depths, etching and fill dimensions, and so on.

At block 542, the method 540 can include labeling the memories 104 based on the determined command signal integrity parameters, the labels including at least a "high-integrity" and a "low-integrity" label. In some embodiments, a predefined percentage (e.g., 20%) of the memories 104 can be labeled with the high-integrity label and a predefined percentage (e.g., 20%) of the memories 104 can be labeled with the low-integrity label. In some embodiments, the predefined percentage can be based on the number of rows 110 and/or columns 112 to be formed on the substrate 102. For example, in some embodiments the memories 104 can be ranked/ordered according to their determined command setup-hold margin (block 541), and a predefined percentage of the memories 104 having the lowest command setup-hold margin (e.g., highest speed and/or signal integrity) can be labeled with the high-integrity label, while a predefined percentage of the memories 104 having the highest command setup-hold margin (e.g., lowest speed and/or signal integrity) can be labeled with the high-integrity label. In some embodiments, the memories 104 can be labeled individually and/or to include more labels than just high integrity low integrity. For example, the memories 104 can be individually labeled by ranking the command signal integrity parameter for individual ones of the memories 104 (e.g., the forty memories 104 in the memory device 100 can be ranked from best to worst signal integrity).

At block 543, the method 540 can include electrically coupling the memories 104 to the substrate 102 such that at least some of the memories 104 having the low-integrity label are positioned closer to the RCD 124 than at least some of the memories 104 having the high-integrity label. In some embodiments, the memories 104 can be labeled (block 542) with a high-integrity label HP, a mid-integrity label MP, and a low integrity-label LP and arranged as shown in FIGS. 3A and 3B, and as described in detail above. Similarly, the memories 104 can be labeled (block 542) with multiple different integrity labels P1-P5 (with the label P1 representing the highest signal integrity level and the label P5 representing the lowest signal integrity level) and arranged as shown in FIGS. 4A and 4B, and as described in detail above. In other embodiments, the memories 104 can be labeled (block 542) with more discrete/distinct labels and positioned on the substrate 102 such that individual ones of the memories 104 with lower command signal integrity are positioned closer to the RCD 124 than individual ones of the memories 104 with higher command signal integrity.

In some aspects of the present technology, positioning the memories 104 along the substrate 102 in this manner can improve one or more characteristics of the memory device 100 by for example, reducing the power consumption of the memory device 100, increasing the speed of the memory device 100, and so on. More specifically, referring to FIGS. 3A and 3B for example, the memories 104 having the high-integrity label HP are positioned farthest from the RCD 124 where they receive the least precise timing signals (e.g., command, address, and/or clock signals) from the RCD 124 over the second electrical lines 126—but the less precise timing signals can have less impact on the speed and signal integrity of these memories 104 due to the high-integrity characteristics of these ones of the memories 104 (e.g., having the high-integrity label HP). Conversely, the memories 104 having the low-integrity label LP are positioned closest to the RCD 124, where they receive the most precise timing signals from the RCD 124—which can ensure optimal speed and signal integrity for these ones of the memories 104. That is, the memories 104 having the low-integrity label LP receive more robust and precise timing signals (e.g., timing signals having sharper edges) from the RCD 124 than the memories having 104 having the high-integrity label HP. Similarly, the memories 104 having the mid-integrity label MP are positioned farther from the RCD 124 than the memories 104 having the low-integrity label LP but closer to the RCD 124 than the memories 104 having the high-integrity label HP—where they receive timing signals having a preciseness/sharpness between that received at the memories 104 having the low-integrity label LP and the high-integrity label HP. Accordingly, the memories 104 are positioned along the substrate 102 to optimize their performance based on their individual command signal integrity parameters that may differ from variations in the memory manufacturing process. In contrast, conventional manufacturing techniques simply place memories along a substrate randomly, without consideration for process variations in the memories and the resulting effect on command signal integrity caused by varying timing signals due to the placement of the memories on the substrate.

Figure 6:
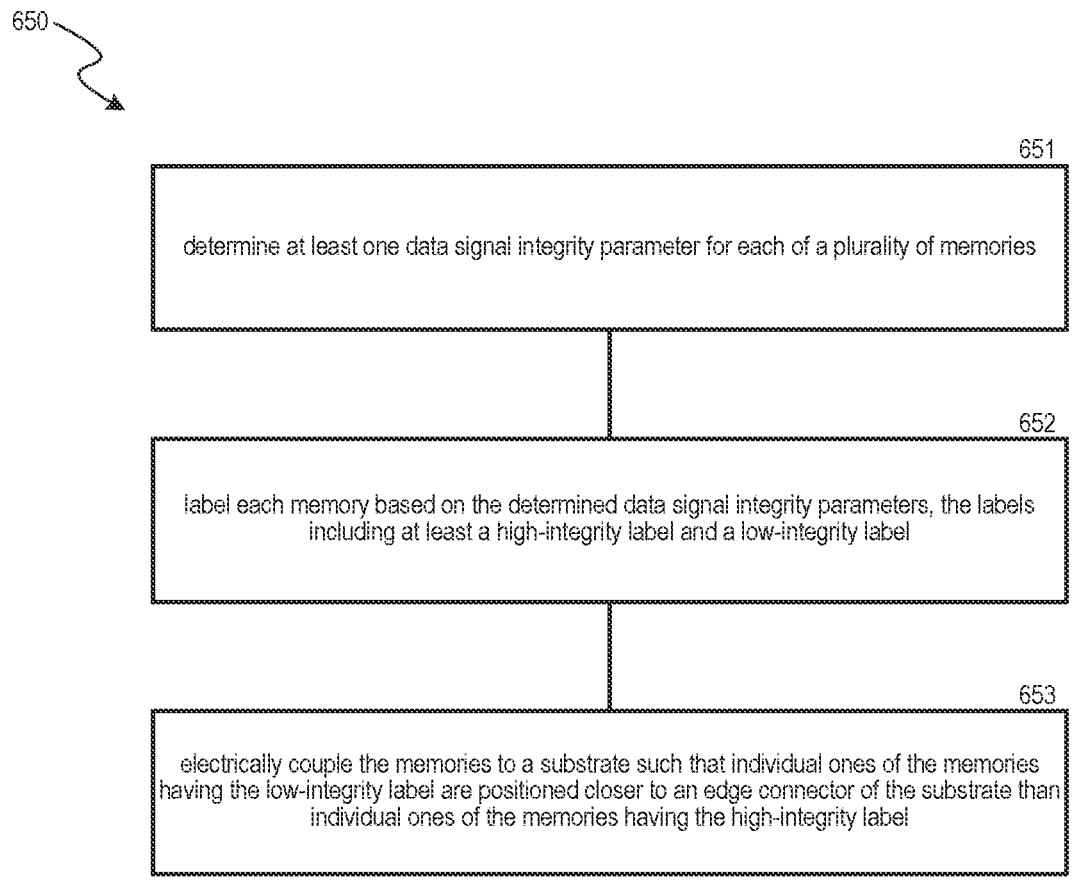
FIG. 6 is a flow diagram of a process or method for optimizing the placement of memories in the memory device of FIGS. 1A-1C in accordance with additional embodiments of the present technology.

FIG. 6 is a flow diagram of a process or method 650 for optimizing the placement of the memories 104 in the memory device 100 in accordance with additional embodiments of the present technology. Although some features of the method 650 are described in the context of the embodiments of the memory device 100 for the sake of illustration, one skilled in the art will readily understand that the method 650 can be carried out to optimize the placement of memories in other memory devices having other configurations, arrangements, etc. In some embodiments, the method 650 can include some steps that are at least generally similar to the corresponding steps of the method 230 and/or the method 540 described in detail above with reference to FIGS. 2 and 5.

Beginning at block 651, the method 650 includes determining at least one data signal integrity characteristic/level/parameter for each of the plurality of memories 104. For example, after manufacturing the memories 104, the memories 104 can be tested to determine the data signal integrity parameters. In some embodiments, the data signal integrity parameter can be a setup time, a hold time, a setup-hold margin, an edge rate, a data eye height, a data eye width, and/or another parameter of the memories 104. In some embodiments, the data signal integrity parameter can be determined using one or more electrical probes. In some aspects of the present technology, the data signal integrity parameter can be different for some or all of the memories 104 due to variations in the process used to manufacture the memories 104, such as variations in impurity concentration density, oxide thicknesses and diffusion depths, etching and fill dimensions, and so on.

At block 652, the method 650 can include labeling the memories 104 based on the determined data signal integrity parameters, the labels including at least a "high-integrity" and a "low-integrity" label. In some embodiments, a predefined percentage (e.g., 50%) of the memories 104 can be labeled with the high-integrity label and a predefined percentage (e.g., 50%) of the memories 104 can be labeled with the low-integrity label. For example, in some embodiments the memories 104 can be ranked/ordered according to their determined data setup-hold margin (block 541), and a predefined percentage of the memories 104 having the lowest data setup-hold margin (e.g., highest speed and/or signal integrity) can be labeled with the high-integrity label, while a predefined percentage of the memories 104 having the highest data setup-hold margin (e.g., lowest speed and/or signal integrity) can be labeled with the low-integrity label. In some embodiments, the memories 104 can be labeled individually and/or to include more labels than just high-integrity and low-integrity. For example, the memories 104 can be individually labeled by ranking the data signal integrity parameter for individual ones of the memories 104 (e.g., the forty memories 104 in the memory device 100 can be ranked from best to worst data signal integrity).

Figure 7A:
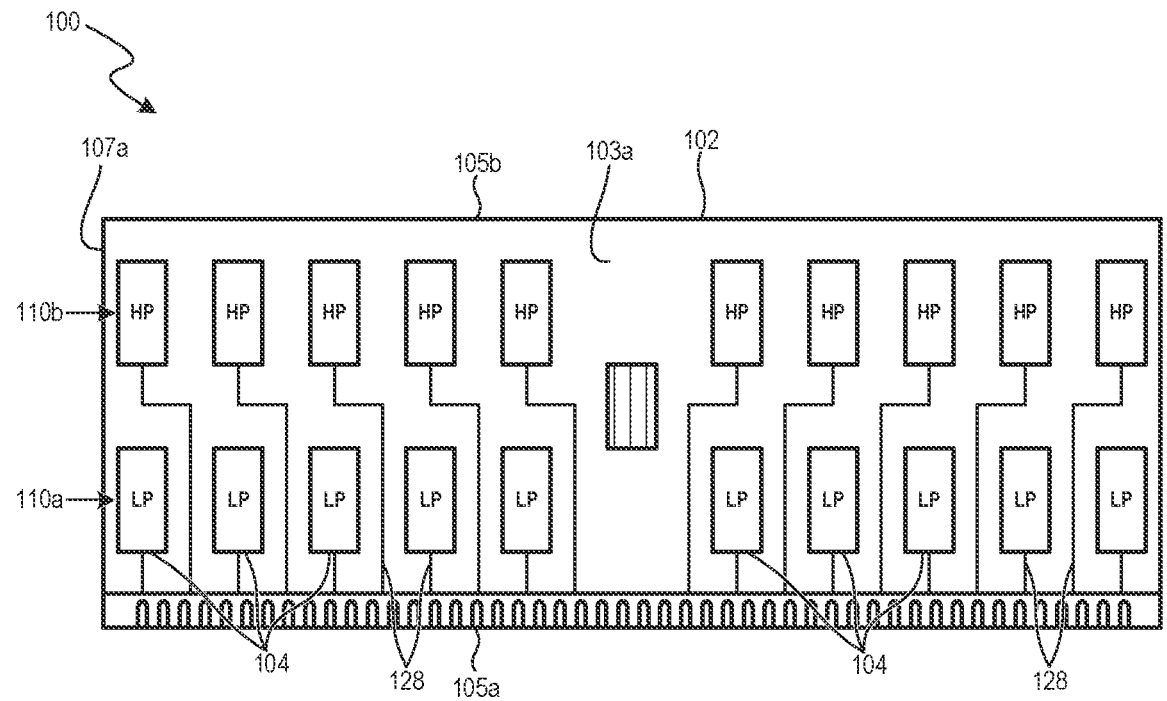
FIGS. 7A and 7B are front and back views, respectively, illustrating the optimized positioning of memories in the memory device of FIGS. 1A-1C in accordance with additional embodiments of the present technology.
Figure 7B:
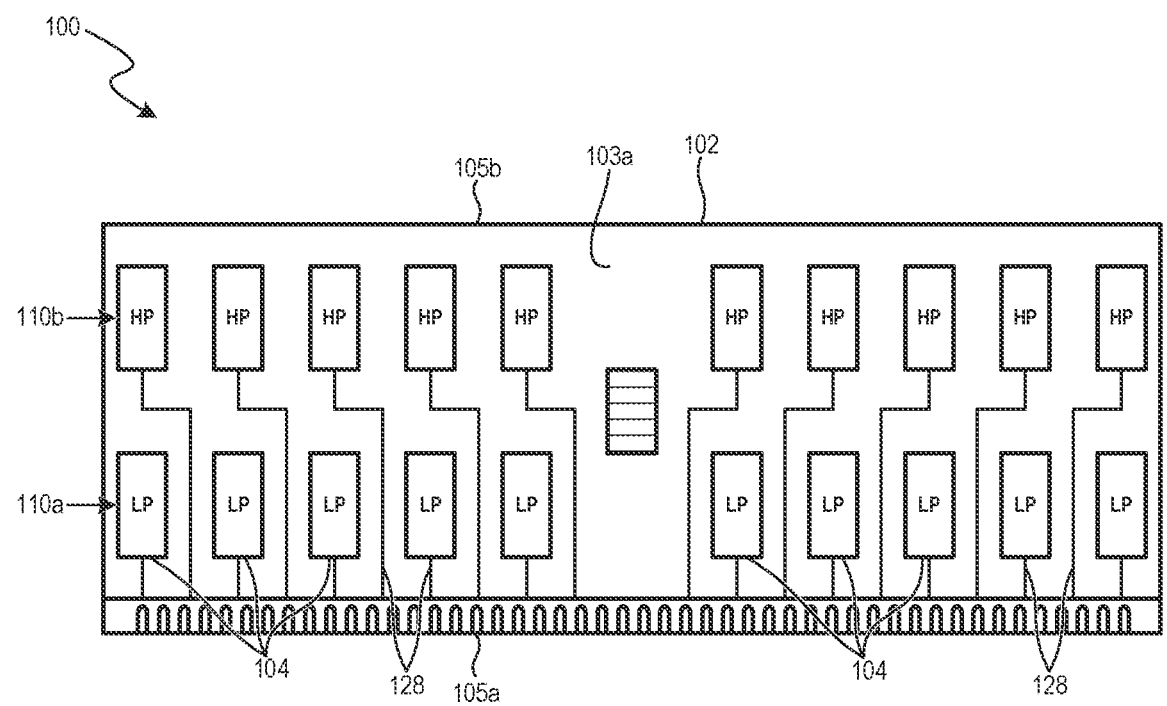

At block 653, the method 650 can include electrically coupling the memories 104 to the substrate 102 such that at least some of the memories 104 having the low-integrity label are positioned closer to the edge connector 106 than at least some of the memories 104 having the high-integrity label. FIGS. 7A and 7B, for example, are front and back views, respectively, illustrating the positioning of the memories 104 on the substrate 102 of the memory device 100 in accordance with embodiments of the present technology. In the illustrated embodiment, twenty of the memories 104 (e.g., ten each on the first side 103a and the second side 103b of the substrate 102) have a high-integrity label HP and twenty of the memories 104 (e.g., ten each on the first side 103a and the second side 103b of the substrate 102) have a low-integrity label LP. In some embodiments, at block 651, a predefined percentage (e.g., 50%) of the memories 104 can be labeled with the high-performance label HP and a predefined percentage (e.g., 50%) of the memories 104 can be labeled with the low-performance label LP to facilitate such placement. In some embodiments, the predefined percentages can be based on the number of columns 112 and/or rows 110 to be formed on the substrate 102. In the illustrated embodiment, the memories 104 having the high-integrity label HP are positioned in the second row 110b, while the memories 104 having the low-integrity label LP are positioned in the first row 110a. That is, the memories 104 having the low-performance label LP can be positioned closest to the lower edge 105a of the substrate 102 and the edge connector 106, while the memories 104 having the high-performance label HP can be positioned closest to the upper edge 105b of the substrate 102 farther from the edge connector 106.

In some aspects of the present technology, positioning the memories 104 along the substrate 102 in this manner can improve one or more characteristics of the memory device 100 by for example, reducing the power consumption of the memory device 100, increasing the speed of the memory device 100, and so on. More specifically, with continued reference to FIGS. 7A and 7B for example, the memories 104 having the high-integrity label HP are positioned farthest from the edge connector 106 where they receive the least precise data signals (e.g., read/write data signals from a host device connected to the edge connector 106 during memory access operations) from the edge connector 106 over the third electrical lines 128. However, the less precise data signals can have less impact on the speed and signal integrity of these memories 104 due to the high signal integrity characteristics of these memories 104 (e.g., having the high-integrity label HP). Conversely, the memories 104 having the low-integrity label LP are positioned closest to the edge connector 106, where they receive the most precise data signals from the edge connector 106—which can ensure optimal speed and signal integrity for these memories 104. That is, the memories 104 having the low-integrity label LP can receive more robust and precise data signals (e.g., data signals having sharper edges) from the edge connector 106 than the memories having 104 having the high-integrity label HP. Accordingly, the memories 104 are positioned along the substrate 102 to optimize their performance based on their individual data signal integrity parameters that may differ from variations in the memory manufacturing process. In contrast, conventional manufacturing techniques simply place memories along a substrate randomly, without consideration for process variations in the memories and the resulting effect on data signal integrity caused by varying data signals due to the placement of the memories on the substrate.

Figure 8:
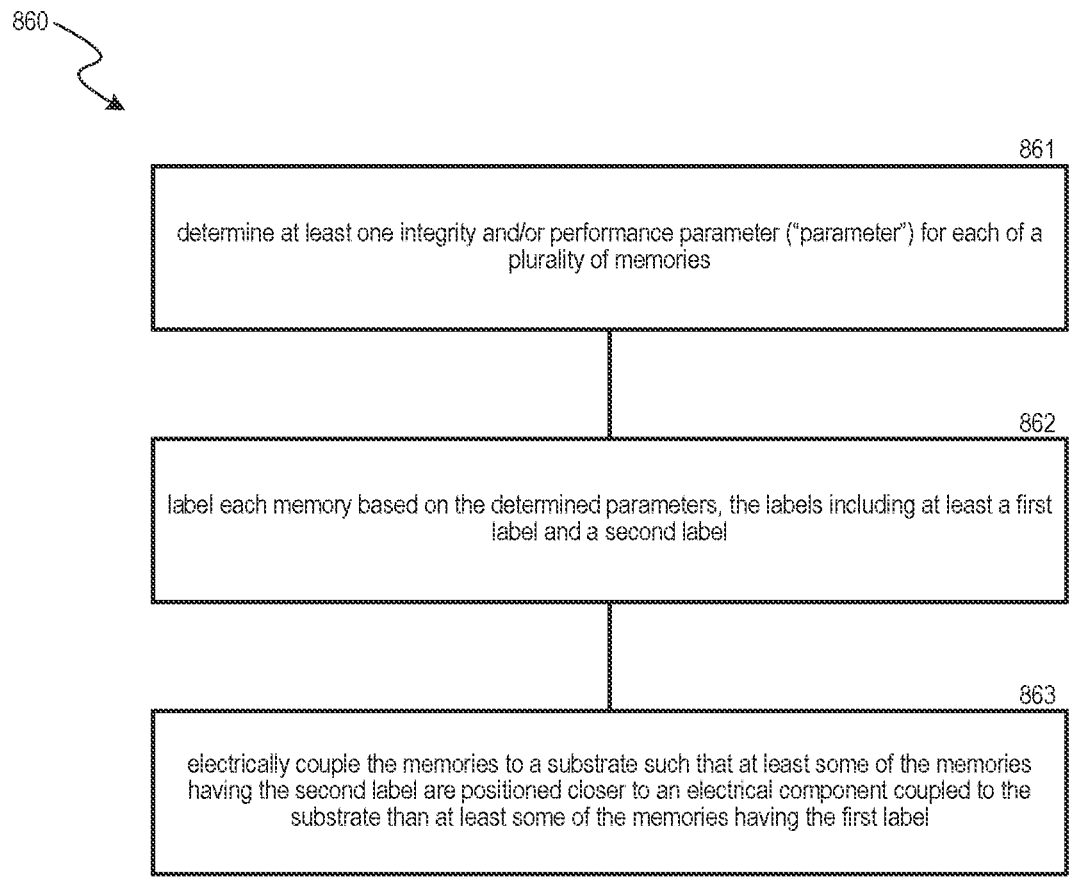
FIG. 8 is a flow diagram of a process or method for optimizing the placement of memories in the memory device of FIGS. 1A-1C in accordance with additional embodiments of the present technology.

FIG. 8 is a flow diagram of a process or method 860 for optimizing the placement of the memories 104 in the memory device 100 in accordance with additional embodiments of the present technology. Although some features of the method 860 are described in the context of the embodiments of the memory device 100 for the sake of illustration, one skilled in the art will readily understand that the method 860 can be carried out to optimize the placement of memories in other memory devices having other configurations, arrangements, etc. In some embodiments, the method 860 can include some steps that are at least generally similar to the corresponding steps of the method 230, the method 540, and/or the method 650 described in detail above with reference to FIGS. 2, 5, and 6.

At block 861, the method 860 can include determining at least one integrity and/or performance characteristic/level/parameter ("parameter") for each of the plurality of memories 104. In some embodiments, the parameter can indicate an ability of each of the memories 104 to process signals from an electrical component (e.g., a hardware component) of the memory device 100, such as the PMIC 120, the RCD 124, and/or the edge connector 106. For example, block 861 of the method 860 can include determining (i) a power and/or speed performance parameter indicating an ability of each of the memories 104 to process power signals from the PMIC 120 as described in detail above with reference to FIG. 2, (ii) a command, address, and/or clock signal integrity parameter indicating an ability of each of the memories 104 to process timing signals from the RCD 124 as described in detail above with reference to FIG. 5, (iii) a data signal integrity parameter indicating an ability of each of the memories 104 to process data signals from the edge connector 106 as described in detail above with reference to FIG. 6, and/or (iv) other parameters.

At block 862, the method 860 can include labeling the memories 104 based on the determined parameters, the labels including at least a first label and a second label. In some embodiments, the first label can indicate that the memories 104 with the first label are better able to process signals from the electrical component than the memories 104 with the second label. That is, higher/better performing one of the memories 104 can be labeled with the first label and lower/worse performing ones of the memories 104 can be labeled with the second label. For example, the first label can be the high-performance label and the second label can be the low-performance label as described in detail with reference to FIG. 2. Likewise, the first label can be the high-integrity label and the second label can be the low-integrity label as described in detail with reference to FIGS. 5 and/or 6. In some embodiments, the memories 104 can be labeled individually and/or to include more than two labels (e.g., to include the mid-performance label MP of FIGS. 3A and 3B, the performance labels P1-P5 of FIGS. 4A and 4B, etc.).

At block 863, the method 860 can include electrically coupling the memories 104 to the substrate 102 such that at least some of the memories 104 having the second label are positioned closer to the electrical component of the memory device 100 than at least some of the memories 104 having the first label. The electrical component can include the PMIC 120, the RCD 124, the edge connector 106, and/or another electrical component of the memory device 100 For example, as described in detail with reference to FIG. 2, the memories 104 can be arranged on the substrate 102 to be farther from/closer to the PMIC 120 based on the first and second labels to optimize the power signals received by each of the memories 104 from the PMIC 120. Similarly, as described in detail with reference to FIG. 5, the memories 104 can be arranged on the substrate 102 to be farther from/closer to the RCD 124 based on the first and second labels to optimize the command signals received by each of the memories 104 from the RCD 124. Likewise, as described in detail with reference to FIG. 6, the memories 104 can be arranged on the substrate 102 to be farther from/closer to the edge connector 106 based on the first and second labels to optimize the data signals received by each of the memories 104 from the edge connector 106. In this manner, the memories 104 are positioned along the substrate 102 to optimize their performance based on their individual parameters that may differ from variations in the memory manufacturing process.

Figure 9:
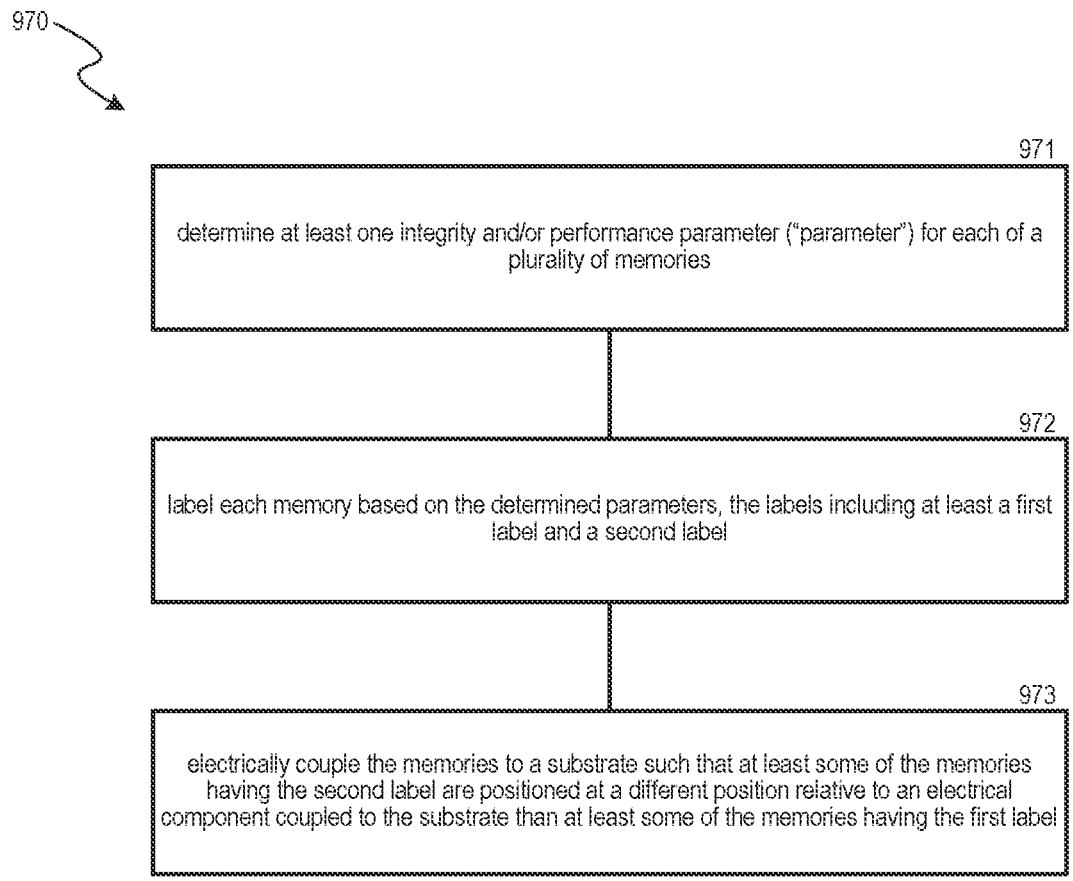
FIG. 9 is a flow diagram of a process or method for optimizing the placement of memories in the memory device of FIGS. 1A-1C in accordance with additional embodiments of the present technology.

FIG. 9 is a flow diagram of a process or method 970 for optimizing the placement of the memories 104 in the memory device 100 in accordance with additional embodiments of the present technology. Although some features of the method 970 are described in the context of the embodiments of the memory device 100 for the sake of illustration, one skilled in the art will readily understand that the method 970 can be carried out to optimize the placement of memories in other memory devices having other configurations, arrangements, etc. In some embodiments, the method 970 can include some steps that are at least generally similar to the corresponding steps of the method 230, the method 540, the method 650, and/or the method 860 described in detail above with reference to FIGS. 2, 5, 6, and 8. For example, blocks 971 and 972 of the method 970 can be identical to blocks 861 and 862, respectively, of the method 860 of FIG. 8.

At block 973, the method 970 can include electrically coupling the memories 104 to the substrate 102 such that at least some of the memories 104 having the second label are positioned at a different position relative to the electrical component of the memory device 100 than at least some of the memories 104 having the first label. In some embodiments, the positions of the memories 104 having the first and second labels can be optimized positions of the memories 104 relative to the electrical component. For example, as described in detail above, the first label can indicate that the memories 104 with the first label are better able to process signals from the electrical component than the memories 104 with the second label. However, in some embodiments the voltage drops across the first electrical lines 122, the second electrical lines 126, and/or the third electrical lines 128 may not be linear, and/or the capacitance/resistance of the of the electrical lines may not correlate exactly with a distance from the electrical component, such that the memories 104 are optimally placed by positioning the memories 104 with the first label closer to or equidistant to the memories 104 with the second label. That is, the individual memories 104 may be optimized for performance by placing higher-performance ones of the memories 104 closer to the electrical component and/or lower-performance ones of the memories 104 farther from the electrical component based on the signal/power characteristics of the substrate 102. Accordingly, block 973 of the method 970 can include positioning the memories 104 along the substrate 102 at any position that optimizes the signals/power received by the memories 104 based on their individual parameters that may differ from variations in the memory manufacturing process.

Figure 10:
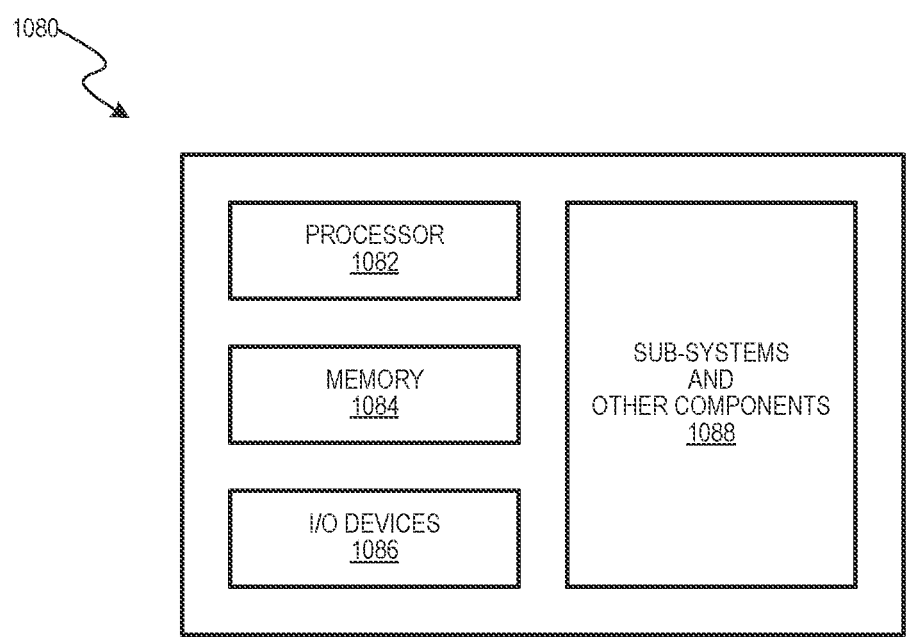
FIG. 10 is a schematic view of a system that includes a memory device in accordance with embodiments of the present technology.

The memory device 100 described in detail above with reference to FIGS. 1-8 and/or packages incorporating the memory device 100 can be incorporated into any of a myriad of larger and/or more complex systems, a representative example of which is system 1080 shown schematically in FIG. 10. The system 1080 can include a processor 1082, a memory 1084 (e.g., SRAM, DRAM, NAND, flash, and/or other memory devices), input/output devices 1086, and/or other subsystems or components 1088. The memory devices and/or packages described above with reference to FIGS. 1-9 can be included in any of the elements shown in FIG. 10. The resulting system 1080 can be configured to perform any of a wide variety of suitable computing, processing, storage, sensing, imaging, and/or other functions. Accordingly, representative examples of the system 1080 include, without limitation, computers and/or other data processors, such as desktop computers, laptop computers, Internet appliances, hand-held devices (e.g., palm-top computers, wearable computers, cellular or mobile phones, personal digital assistants, music players, and so on), tablets, multi-processor systems, processor-based or programmable consumer electronics, network computers, and minicomputers. Additional representative examples of the system 1080 include lights, cameras, vehicles, etc. With regard to these and other example, the system 1080 can be housed in a single unit or distributed over multiple interconnected units, for example, through a communication network. The components of the system 1080 can accordingly include local and/or remote memory storage devices and any of a wide variety of suitable computer-readable media.

The following examples are illustrative of several embodiments of the present technology:

1. A method of optimizing the placement of memories in a memory device including a substrate and an electrical component electrically coupled to the substrate, the method comprising:
   testing the memories to determine at least one parameter for each of the memories, wherein the at least one parameter indicates an ability of the memory to process signals from the electrical component;
   labeling each memory with a label based on the determined parameter, wherein the labels include at least a first label and a second label, and wherein the first label indicates that the memories with the first label are better able to process signals from the electrical component than the memories with the second label; and electrically coupling the memories to the substrate such that the memories with the second label are positioned closer to the electrical component than the memories with the first label.

2. The method of example 1 wherein the electrical component is electrically coupled to a center of the substrate, wherein the memories with the second label are coupled to the substrate adjacent to the electrical component, and wherein the memories with the first label are coupled to the substrate laterally outboard of the memories with the second label.

3. The method of example 1 or example 2 wherein the labels further include a third label, wherein the third label indicates that the memories with third label are (a) better able to process signals from the electrical component than the memories with the second label and (b) worse able to process signals from the electrical component than the memories with the first label, and wherein electrically coupling the memories to the substrate includes electrically coupling the memories to the substrate such that the memories with the third label are positioned between the memories with the first label and the memories with the second label.

4. The method of any one of examples 1-3 wherein the parameter is different for the memories with the first label and the memories with the second label due to variations in a manufacturing process used to manufacture the memories.

5. The method of any one of examples 1-4 wherein the electrical component is a power management integrated circuit (PMIC).

6. The method of example 5 wherein the parameter is a voltage or current level of each the memories.

7. The method of example 5 or example 6 wherein the parameter is a threshold voltage level of each of the memories.

8. The method of any one of examples 5-7 wherein the parameter is a power and/or speed performance parameter of each of the memories.

9. The method of any one of examples 5-8 wherein the first label is a fast-fast (FF) process corner, and wherein the second label is a slow-slow (SS) process corner.

10. The method of any of examples 1-5 wherein the electrical component is a registered clock driver (RCD).

11. The method of example 10 wherein the parameter is at least one of a setup time, a hold time, and a setup-hold margin of each of the memories.

12. The method of any of examples 1-5 wherein the electrical component is an edge connector of the substrate.

13. The method of example 12 wherein the parameter is at least one of a setup time, a hold time, a setup-hold margin, an edge rate, a data eye height, and a data eye width of each of the memories.

14. The method of any of examples 1-13 wherein labeling each memory includes—
ranking the parameters for each of the memories;
labeling individual ones of the memories in a first predefined range of the rankings with the first label; and
labeling individual ones of the memories in a second predefined range of the rankings with the second label.

15. A memory device, comprising:
a substrate;
a power management integrated circuit (PMIC) electrically coupled to the substrate; and
a plurality of memories electrically coupled to the PMIC via the substrate, wherein the memories include a first group of memories and a second group of memories, wherein the memories in the first group of memories are positioned farther from the PMIC than the memories in the second group of memories, wherein each of the memories has a power performance level, and wherein the power performance level of the memories in the first group is higher than the power performance level of the memories in the second group.

16. The memory device of example 15 wherein the power performance level indicates an ability of each memory to process power signals received from the PMIC.

17. A memory device, comprising:
a substrate;
a registered clock driver (RCD) electrically coupled to the substrate; and
a plurality of memories electrically coupled to the RCD via the substrate, wherein the memories include a first group of memories and a second group of memories, wherein the memories in the first group of memories are positioned farther from the RCD than the memories in the second group of memories, wherein each of the memories has a signal integrity level, and wherein the signal integrity level of the memories in the first group is higher than the signal integrity level of the memories in the second group.

18. The memory device of example 17 wherein the signal integrity level indicates an ability of each memory to process command, address, and/or clock signals received from the RCD.

19. A memory device, comprising:
a substrate;
an edge connector electrically coupled to the substrate; and
a plurality of memories electrically coupled to the edge connector via the substrate, wherein the memories include a first group of memories and a second group of memories, wherein the memories in the first group of memories are positioned farther from the edge connector than the memories in the second group of memories, wherein each of the memories has a signal integrity level, and wherein the signal integrity level of the memories in the first group is higher than the signal integrity level of the memories in the second group.

20. The memory device of example 19 wherein the signal integrity level indicates an ability of each memory to process data signals received from the edge connector.

21. A method of optimizing the placement of memories in a memory device including a substrate and an electrical component electrically coupled to the substrate, the method comprising:
testing the memories to determine at least one parameter for each of the memories, wherein the at least one parameter indicates an ability of the memory to process signals from the electrical component;
labeling each memory with a label based on the determined parameter, wherein the labels include at least a first label and a second label, and wherein the first label indicates that the memories with the first label are better able to process signals from the electrical component than the memories with the second label; and electrically coupling the memories to the substrate such that the memories with the second label are positioned at a different position relative to the electrical component than the memories with the first label.

22. The method of example 21 wherein the memories with second label are positioned farther from the electrical component than the memories with the first label.

The above detailed description of embodiments of the present technology are not intended to be exhaustive or to limit the technology to the precise forms disclosed above. Although specific embodiments of, and examples for, the technology are described above for illustrative purposes, various equivalent modifications are possible within the scope of the technology as those skilled in the relevant art will recognize. For example, although steps are presented in a given order, other embodiments may perform steps in a different order. The various embodiments described herein may also be combined to provide further embodiments.

From the foregoing, it will be appreciated that specific embodiments of the technology have been described herein for purposes of illustration, but that well-known structures and functions have not been shown or described in detail to avoid unnecessarily obscuring the description of the embodiments of the technology. Where the context permits, singular or plural terms may also include the plural or singular term, respectively.

As used herein, the phrase "and/or" as in "A and/or B" refers to A alone, B alone, and A and B. To the extent any materials incorporated herein by reference conflict with the present disclosure, the present disclosure controls. Additionally, the term "comprising" is used throughout to mean including at least the recited feature(s) such that any greater number of the same feature and/or additional types of other features are not precluded. It will also be appreciated that specific embodiments have been described herein for purposes of illustration, but that various modifications may be made without deviating from the technology. Further, while advantages associated with some embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method of optimizing the placement of memories in a memory device including a substrate and an electrical component electrically coupled to the substrate, the method comprising:

testing the memories to determine at least one parameter for each of the memories, wherein the at least one parameter indicates an ability of the memory to process signals from the electrical component, and wherein each of the memories comprises multiple semiconductors dies packaged together;

labeling each memory with a label based on the determined parameter, wherein the labels include at least a first label and a second label, and wherein the first label indicates that the memories with the first label are better able to process signals from the electrical component than the memories with the second label; and electrically coupling the memories to the substrate based on the labeling such that the memories with the second label are positioned closer to the electrical component than the memories with the first label.

2. The method of claim 1 wherein the electrical component is electrically coupled to a center of the substrate, wherein the memories with the second label are coupled to the substrate adjacent to the electrical component, and wherein the memories with the first label are coupled to the substrate laterally outboard of the memories with the second label.

3. The method of claim 1 wherein the labels further include a third label, wherein the third label indicates that the memories with third label are (a) better able to process signals from the electrical component than the memories with the second label and (b) worse able to process signals from the electrical component than the memories with the first label, and wherein electrically coupling the memories to the substrate includes electrically coupling the memories to the substrate such that the memories with the third label are positioned between the memories with the first label and the memories with the second label.

4. The method of claim 1 wherein the parameter is different for the memories with the first label and the memories with the second label due to variations in a manufacturing process used to manufacture the memories.

5. The method of claim 1 wherein the electrical component is a power management integrated circuit (PMIC).

6. The method of claim 5 wherein the parameter is a voltage or current level of each the memories.

7. The method of claim 5 wherein the parameter is a threshold voltage level of each of the memories.

8. The method of claim 5 wherein the parameter is a power and/or speed performance parameter of each of the memories.

9. The method of claim 5 wherein the first label is a fast-fast (FF) process corner, and wherein the second label is a slow-slow (SS) process corner.

10. The method of claim 1 wherein the electrical component is a registered clock driver (RCD).

11. The method of claim 10 wherein the parameter is at least one of a setup time, a hold time, and a setup-hold margin of each of the memories.

12. The method of claim 1 wherein the electrical component is an edge connector of the substrate.

13. The method of claim 12 wherein the parameter is at least one of a setup time, a hold time, a setup-hold margin, an edge rate, a data eye height, and a data eye width of each of the memories.

14. The method of claim 1 wherein labeling each memory includes— ranking the parameters for each of the memories;

labeling individual ones of the memories in a first predefined range of the rankings with the first label; and labeling individual ones of the memories in a second predefined range of the rankings with the second label.

15. A memory device, comprising:

a substrate;

a power management integrated circuit (PMIC) electrically coupled to the substrate; and a plurality of memories electrically coupled to the PMIC via the substrate, wherein each of the memories comprises multiple semiconductors dies packaged together, wherein the memories include a first group of memories and a second group of memories, wherein the memories in the first group of memories are positioned farther from the PMIC than the memories in the second group of memories, wherein each of the memories has a power performance level, and wherein the power performance level of the memories in the first group is higher than the power performance level of the memories in the second group.

16. The memory device of claim 15 wherein the power performance level indicates an ability of each memory to process power signals received from the PMIC.

17. A memory device, comprising:
a substrate;
a registered clock driver (RCD) electrically coupled to the substrate; and
a plurality of memories electrically coupled to the RCD via the substrate, wherein each of the memories comprises multiple semiconductors dies packaged together, wherein the memories include a first group of memories and a second group of memories, wherein the memories in the first group of memories are positioned farther from the RCD than the memories in the second group of memories, wherein each of the memories has a signal integrity level, and wherein the signal integrity level of the memories in the first group is higher than the signal integrity level of the memories in the second group.

18. The memory device of claim 17 wherein the signal integrity level indicates an ability of each memory to process command, address, and/or clock signals received from the RCD.

19. A memory device, comprising:
a substrate;
an edge connector electrically coupled to the substrate; and
a plurality of memories electrically coupled to the edge connector via the substrate, wherein each of the memories comprises multiple semiconductors dies packaged together, wherein the memories include a first group of memories and a second group of memories, wherein the memories in the first group of memories are positioned farther from the edge connector than the memories in the second group of memories, wherein each of the memories has a signal integrity level, and wherein the signal integrity level of the memories in the first group is higher than the signal integrity level of the memories in the second group.

20. The memory device of claim 19 wherein the signal integrity level indicates an ability of each memory to process data signals received from the edge connector.

21. A method of optimizing the placement of memories in a memory device including a substrate and an electrical component electrically coupled to the substrate, the method comprising:
testing the memories to determine at least one parameter for each of the memories, wherein the at least one parameter indicates an ability of the memory to process signals from the electrical component, and wherein each of the memories comprises multiple semiconductors dies packaged together;
labeling each memory with a label based on the determined parameter, wherein the labels include at least a first label and a second label, and wherein the first label indicates that the memories with the first label are better able to process signals from the electrical component than the memories with the second label; and
electrically coupling the memories to the substrate such that the memories with the second label are positioned at a different position relative to the electrical component than the memories with the first label.

22. The method of claim 21 wherein the memories with second label are positioned farther from the electrical component than the memories with the first label.

* * * * *